(12) United States Patent
Zhang

(10) Patent No.: US 11,862,232 B2
(45) Date of Patent: Jan. 2, 2024

(54) CIRCUIT AND METHOD FOR DATA TRANSMISSION, AND STORAGE APPARATUS

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 13 days.

(21) Appl. No.: 17/742,654

(22) Filed: May 12, 2022

(65) Prior Publication Data

US 2023/0127370 A1    Apr. 27, 2023

(30) Foreign Application Priority Data

Oct. 27, 2021  (CN) .......................... 202111256983.1

(51) Int. Cl.
*G11C 11/409* (2006.01)
(52) U.S. Cl.
CPC ................................ *G11C 11/409* (2013.01)
(58) Field of Classification Search
CPC ................................ G11C 7/10; G11C 11/409
USPC .................................................... 365/189.011
See application file for complete search history.

(56) References Cited

U.S. PATENT DOCUMENTS

| 10,068,648 | B1* | 9/2018 | Mai ........................ G11C 5/063 |
| 10,636,475 | B2 | 4/2020 | Jun | |
| 2010/0195413 | A1* | 8/2010 | Shimizu ............... G11C 7/1069 |
| | | | | 365/219 |
| 2010/0208534 | A1* | 8/2010 | Fujisawa ................ G11C 7/222 |
| | | | | 365/194 |

FOREIGN PATENT DOCUMENTS

CN    109976665 A    7/2019

\* cited by examiner

*Primary Examiner* — Anthan Tran
(74) *Attorney, Agent, or Firm* — Cooper Legal Group, LLC

(57) ABSTRACT

A circuit and method for data transmission, and a storage apparatus are provided. A mode register decoding module is configured to generate a mode register unselected enable signal, a mode register read enable signal, or a mode register write enable signal according to received mode register address information, a mode register read control signal, or a mode register write control signal. A mode register read-write module is configured to: cache data on data line according to mode register write enable signal in write state, and output selected data and unselected data after setting the unselected data to zero according to the mode register read enable signal and the mode register unselected enable signal in a read state. The logic gate module is configured to calculate an OR value of the data outputted by each mode register read-write module in the read state and output a calculation result.

16 Claims, 9 Drawing Sheets

CIRCUIT AND METHOD FOR DATA TRANSMISSION, AND STORAGE APPARATUS

CROSS-REFERENCE TO RELATED APPLICATION

This application is based upon and claims priority to Chinese Patent Application No. 202111256983.1, filed on Oct. 27, 2021, the entire contents of which are incorporated herein by reference.

BACKGROUND

A semiconductor memory apparatus usually includes a memory array area and a peripheral circuit area. The memory array area is provided with a memory unit array including multiple storage units. The peripheral circuit area is provided with a control circuit for read-write control and a mode register for setting parameters of the memory apparatus. The control circuit for read-write control needs to perform functions of reading data and writing data according to a control instruction, and mode register parameters are no exception. Writing data to the mode register or reading out the mode register parameters from the mode register, the transmitted data is transmitted via multiple signal transmission wires through the mode register read-write module.

In a conventional semiconductor memory apparatus, the mode register read-write module is connected to an internal cache module for caching the mode register parameters via multiple signal transmission wires. In order to avoid influences such as inter-symbol interference during data transmission, a signal transmission path between different mode register read-write modules and the internal cache module for caching the mode register parameters transmits the data in parallel, resulting in large number of signal transmission wires between the mode register read-write module and the internal cache module, complex wiring, and increasing energy consumption during signal transmission.

SUMMARY

The disclosure relates to the field of integrated circuits, and in particular, to a circuit and method for data transmission, and a storage apparatus.

Based on this, and in view of the technical problems in the Background, it is necessary to provide a circuit and method for data transmission, and a storage apparatus. In this way, the number of signal transmission wires between a mode register read-write module and an internal cache module for caching mode register parameters can be effectively decreased, the complexity of wiring can be decreased, and the energy consumption during signal transmission can be reduced on the premise of ensuring the efficiency and accuracy of data transmission.

In order to achieve the above objective and other objectives, an aspect of the disclosure provides a circuit for data transmission, including multiple mode register decoding modules, multiple mode register read-write modules, and a logic gate module. The mode register decoding module is configured to generate a mode register unselected enable signal, a mode register read enable signal, or a mode register write enable signal according to received mode register address information, a mode register read control signal, or a mode register write control signal. The mode register read-write module is disposed corresponding to the mode register decoding module. The mode register read-write module is electrically connected to a data line, a first cache module, and the corresponding mode register decoding module. The mode register read-write module in a write state is configured to cache data on the data line according to the received mode register write enable signal, and the mode register read-write module in a read state is further configured to output selected data and the unselected data after setting the unselected data to zero according to the mode register read enable signal and the mode register unselected enable signal. The logic gate module is electrically connected to the first cache module and each mode register read-write module, and configured to calculate an OR value of the data outputted by each mode register read-write module in the read state and output a calculation result.

Still another aspect of the disclosure provides a method for data transmission. The method includes the following operations.

Mode register decoding modules are controlled to generate a mode register unselected enable signal, a mode register read enable signal, or a mode register write enable signal in response to mode register address information, a mode register read control signal, or a mode register write control signal.

Mode register read-write modules disposed corresponding to the mode register decoding modules are controlled to cache data on a data line in a write state in response to the mode register write enable signal, and are controlled to output selected data and unselected data after setting the unselected data to zero in a read state in response to the mode register read enable signal and the mode register unselected enable signal.

A logic gate module is controlled to calculate an OR value of the data outputted by each mode register read-write module in the read state and output a calculation result.

BRIEF DESCRIPTION OF THE DRAWINGS

In order to more clearly illustrate the technical solutions in the embodiments of the disclosure, the drawings used in the technical description of the embodiments will be briefly described below. It is apparent that the drawings in the following descriptions are merely some embodiments of the disclosure. Other drawings can be obtained from those skilled in the art according to these drawings without any creative work.

ILLUSTRATION OF REFERENCE NUMERALS

Figure 1:
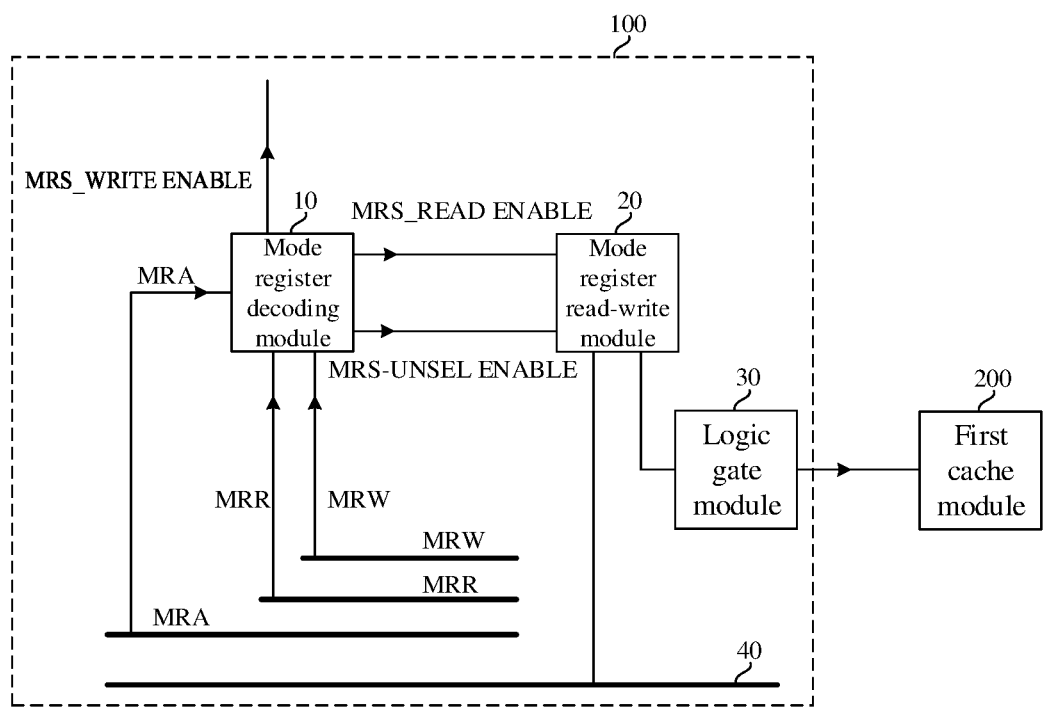
FIG. 1 is a schematic diagram of a circuit principle of a circuit for data transmission according to an embodiment of the disclosure.

100: Circuit for data transmission; 10: Mode register decoding module; 20: Mode register read-write module; 30: Logic gate module; 40: Data line; 200: First cache module; 201: Mode register read module; 300: Data receiver; 400: Mask receiver; 21: First class mode register read-write module; 22: Second class mode register read-write module; 211: First mode register read-write module; 212: Second mode register read-write module; 213: Third mode register read-write module; 214: Fourth mode register read-write module; 215: Fifth mode register read-write module; 216: Sixth mode register read-write module; 217: Seventh mode register read-write module; 218: Eighth mode register read-write module; 2011: First buffer unit; 2012: Second buffer unit; 2013: Output driving unit.

DETAILED DESCRIPTION

For easy of understanding the disclosure, the disclosure will be described in detail below with reference to the related drawings. Preferred embodiments of the disclosure are given in the drawings. However, the disclosure may be implemented in many different forms, and is not limited to the embodiments described herein. Rather, the embodiments are provided so that the content of the disclosure will be made more thorough and comprehensive.

Unless otherwise defined, all technical and scientific terms used herein have the same meaning as commonly understood by those skilled in the art to which the disclosure belongs. The terms used herein in the specification of the disclosure are for the purpose of describing the specific embodiments only and are not intended to be limiting of the disclosure.

In addition, certain terms used throughout the specification and the following claims refer to specific elements. Those skilled in the art will appreciate that manufacturers may refer to the elements with different names. This document does not intend to distinguish the elements with different names but same functionality. In the following description and embodiments, both the terms "comprising" and "including" are used openly, and therefore should be interpreted as "comprising, but not limited to . . . ". Likewise, the term "connect" is intended to express an indirect or direct electrical connection. Correspondingly, if one device is connected to another device, the connection may be done through a direct electrical connection, or through an indirect electrical connection of another device and a connector.

It is to be understood that, although the terms "first," "second," and the like may be used herein to describe various elements, these elements should not be limited by these terms. These terms are only used to distinguish one element from another. For example, a first element could be termed a second element, and, similarly, a second element could be termed a first element, without departing from the scope of the disclosure.

A technical principle on which the implementation of the disclosure is based is exemplarily described below by using the fifth-generation Double Data Rate Synchronous Dynamic Random Access Memory (DDR5) as an example.

Table 1 and Table 2 record code names of mode registers in a Joint Electron Device Engineering Council (JEDEC) standard and a corresponding Mode Register Address (MRA) information. By observing Table 1 and Table 2, it is to be discovered that the address information of the mode register configured to set a receiver DML-related parameters differs only in the last three bits. The address information of other mode registers that set different codes of a same receiver also differs only in the last three bits. Therefore, with regard to the address information of the mode registers (with different codes) configured to set the receiver DML-related parameters, the first five bits of the address information decoded by the corresponding mode register decoding module may share 01110. With regard to the address information of other mode registers that set different codes of the same receiver, the decoded address information may share the first five bits of data. For example, with regard to the 128-th mode register to the 135-th mode register configured to set receiver DQ0-related parameters, the first five bits of the address information decoded by the corresponding mode register decoding module may share 10000. With regard to the 160-th mode register to the 167-th mode register configured to set receiver DQ4-related parameters, the first five bits of the address information decoded by the corresponding mode register decoding module may share 10100.

TABLE 1

| MR# | DML | BIN_DML | DQL0 | BIN_DQL0 | DQL1 | BIN_DQL1 | DQL2 | BIN_DQL2 | DQL3 | BIN_DQL3 |
|---|---|---|---|---|---|---|---|---|---|---|
| | 112 | 1110000 | 128 | 10000000 | 136 | 10001000 | 144 | 10010000 | 152 | 10011000 |
| | 113 | 1110001 | 129 | 10000001 | 137 | 10001001 | 145 | 10010001 | 153 | 10011001 |
| | 114 | 1110010 | 130 | 10000010 | 138 | 10001010 | 146 | 10010010 | 154 | 10011010 |
| | 115 | 1110011 | 131 | 10000011 | 139 | 10001011 | 147 | 10010011 | 155 | 10011011 |
| | 116 | 1110100 | 132 | 10000100 | 140 | 10001100 | 148 | 10010100 | 156 | 10011100 |
| | 117 | 1110101 | 133 | 10000101 | 141 | 10001101 | 149 | 10010101 | 157 | 10011101 |
| | 118 | 1110110 | 134 | 10000110 | 142 | 10001110 | 150 | 10010110 | 158 | 10011110 |
| | 119 | 1110111 | 135 | 10000111 | 143 | 10001111 | 151 | 10010111 | 159 | 10011111 |
| SEL CODE | | 01110XXX | | 10000XXX | | 10001XXX | | 10010XXX | | 10011XXX |

TABLE 2

| MR# | DML | BIN_DML | DQL4 | BIN_DQL4 | DQL5 | BIN_DQL5 | DQL6 | BIN_DQL6 | DQL7 | BIN_DQL7 |
|---|---|---|---|---|---|---|---|---|---|---|
| | 112 | 1110000 | 160 | 10100000 | 168 | 10101000 | 176 | 10110000 | 184 | 10111000 |
| | 113 | 1110001 | 161 | 10100001 | 169 | 10101001 | 177 | 10110001 | 185 | 10111001 |
| | 114 | 1110010 | 162 | 10100010 | 170 | 10101010 | 178 | 10110010 | 186 | 10111010 |
| | 115 | 1110011 | 163 | 10100011 | 171 | 10101011 | 179 | 10110011 | 187 | 10111011 |

TABLE 2-continued

| MR# | DML | BIN_DML | DQL4 | BIN_DQL4 | DQL5 | BIN_DQL5 | DQL6 | BIN_DQL6 | DQL7 | BIN_DQL7 |
|---|---|---|---|---|---|---|---|---|---|---|
| | 116 | 1110100 | 164 | 10100100 | 172 | 10101100 | 180 | 10110100 | 188 | 10111100 |
| | 117 | 1110101 | 165 | 10100101 | 173 | 10101101 | 181 | 10110101 | 189 | 10111101 |
| | 118 | 1110110 | 166 | 10100110 | 174 | 10101110 | 182 | 10110110 | 190 | 10111110 |
| | 119 | 1110111 | 167 | 10100111 | 175 | 10101111 | 183 | 10110111 | 191 | 10111111 |
| SEL CODE | | 01110XXX | | 10100XXX | | 10101XXX | | 10110XXX | | 10111XXX |

In order to effectively decrease the number of signal transmission wires between receivers and internal cache modules configured to cache mode register parameters and reduce the complexity of wiring, the energy consumption during signal transmission can be reduced on the premise of ensuring the efficiency and accuracy of data transmission. The disclosure is intended to provide a circuit and method for data transmission, and a storage apparatus.

Referring to FIG. 1, an embodiment of the disclosure provides a circuit 100 for data transmission, including multiple mode register decoding modules 10, multiple mode register read-write modules 20, and a logic gate module 30. Each mode register decoding module 10 is configured to generate a mode register unselected enable signal MRS-UNSEL ENABLE, a mode register read enable signal MRS_READ ENABLE, or a mode register write enable signal MRS_WRITE ENABLE according to received mode register address information MRA, a mode register read control signal MRR, or a mode register write control signal MRW. Each mode register read-write module 20 is disposed corresponding to the mode register decoding module 10. The mode register read-write module 20 is electrically connected to a data line 40, a first cache module 200, and the corresponding mode register decoding module 10. The mode register read-write module in a write state is configured to cache data on the data line 40 according to the received mode register write enable signal MRS_WRITE ENABLE, and the mode register read-write module 20 in a read state further configured to output selected data and output unselected data after setting the unselected data to zero according to the received mode register read enable signal MRS_READ ENABLE and the mode register unselected enable signal MRS-UNSEL ENABLE. The logic gate module 30 is electrically connected to the first cache module 200 and each mode register read-write module, and configured to calculate an OR value of the data outputted by each mode register read-write module 20 in the read state and output a calculation result.

Specifically, continuously referring to FIG. 1, the data line 40 is configured to transmit mode register parameters. The mode register parameters may include a parameter used for setting the mask receiver DM and a parameter used for setting the data receiver DQ. The mode register decoding module 10 generates the mode register read enable signal MRS_READ ENABLE and the mode register unselected enable signal MRS-UNSEL ENABLE according to the received mode register address information MRA and the mode register read control signal MRR. The mode register decoding module 10 generates the mode register write enable signal MRS_WRITE ENABLE according to the received mode register address information MRA and the mode register write control signal MRW. The mode register read enable signal MRS_READ ENABLE is used for controlling the mode register read-write module 20 to perform an operation of reading the mode register parameters. The mode register unselected enable signal MRS-UNSEL ENABLE is used for controlling the mode register read-write module 20 to output the unselected mode register parameters after setting the unselected mode register parameters to zero in the process of reading the mode register parameters and to output the selected mode register parameters. For example, when the mode register unselected enable signal is 0, the mode register read-write module 20 outputs the parameters in the selected mode register in the process of reading the mode register parameters. When the mode register unselected enable signal is 1, the mode register read-write module 20 outputs 0 in the process of reading the mode register parameters. The mode register read-write module 20 in the write state is configured to cache the data on the data line 40 according to the received mode register write enable signal MRS_WRITE ENABLE. By setting the mode register decoding module 10 to generate the mode register unselected enable signal MRS-UNSEL ENABLE, the mode register read enable signal MRS_READ ENABLE, or the mode register write enable signal MRS_WRITE ENABLE according to the received mode register address information MRA, the mode register read control signal MRR, or the mode register write control signal MRW; by setting the mode register read-write module to cooperate with the mode register decoding modules 10 which is set in one-to-one correspondence with the mode register read-write module, the mode register read-write module in the read state outputs the selected data and the unselected data after setting the unselected data to zero according to the received mode register read enable signal MRS_READ ENABLE and the mode register unselected enable signal MRS-UNSEL ENABLE, to provide to the logic gate module 30; and by sharing the logic gate module 30, the OR values of the data outputted by each mode register read-write module 20 in the read state are calculated and the calculation result is output. Since the logic gate module 30 calculates the OR values, and an unselected register outputs 0, the OR value outputted by the logic gate module 30 only represents a parameter of the selected register. On the premise of accurately and efficiently outputting the selected mode register parameters and outputting the mode register parameters selected by the mode register unselected enable signal MRS-UNSEL ENABLE after setting the mode register parameters to zero, the sharing of the data transmission path where the logic gate module 30 is located can effectively decrease the number of the signal transmission wires between the mode register read-write module and the cache module inside memory for caching the mode register parameters, and reduce the complexity of wiring. Since the number of the signal transmission wires is decreased, stray capacitance between the adjacent wires can be effectively reduced. Therefore, energy consumption and interference between signals during signal transmission can be reduced, a space area occupied by wire layout can be decreased, and the performance and reliability degradation caused by wire failure can be reduced.

Figure 2:
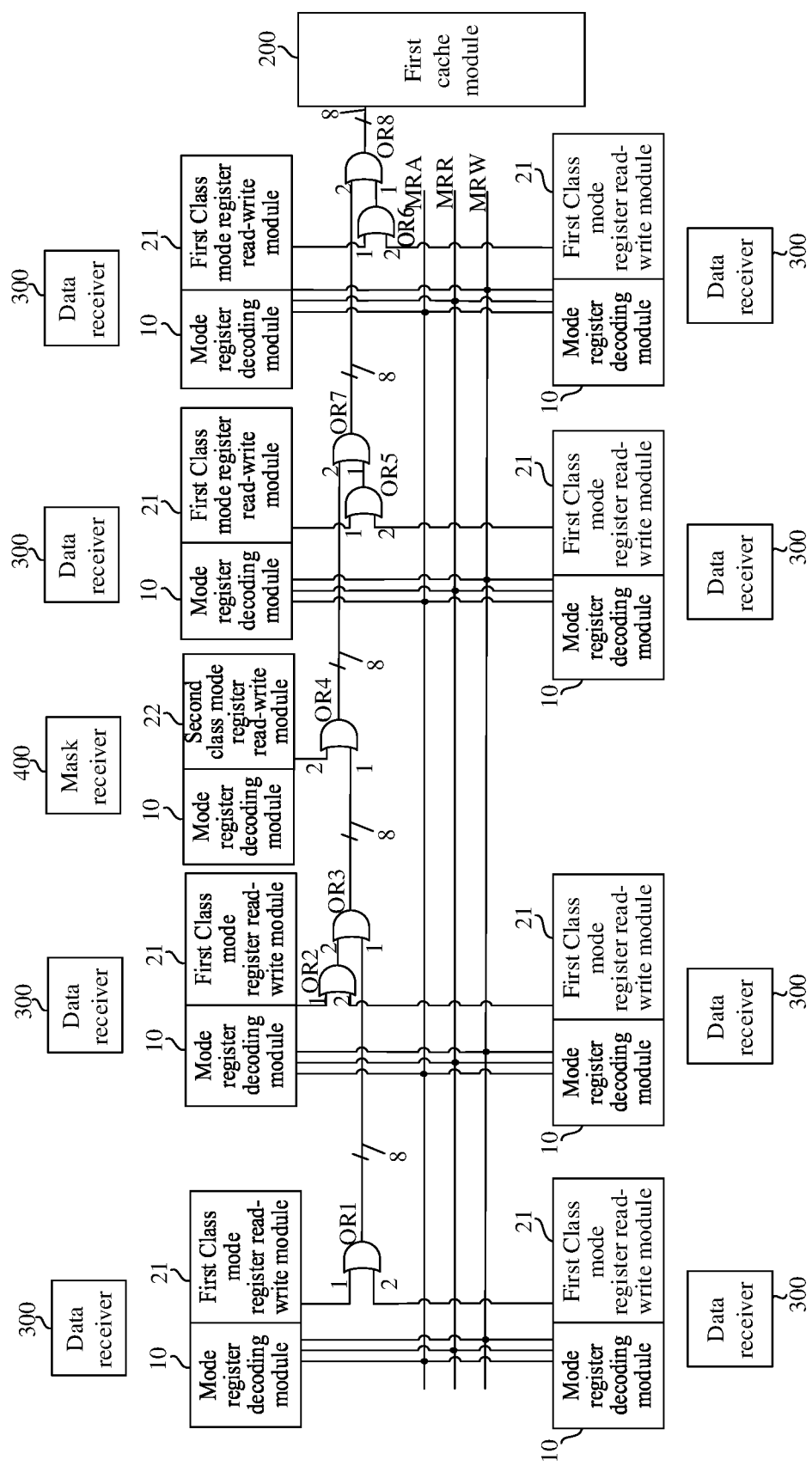
FIG. 2 is a schematic diagram of a circuit principle of a circuit for data transmission according to another embodiment of the disclosure.

Referring to FIG. 2, in some embodiments of the disclosure, the mode register decoding module 10 is in one-to-one correspondence with the receiver. The receiver includes a mask receiver 400 and multiple data receivers 300. The mode register read-write module 20 includes first class mode register read-write modules 21 in one-to-one correspondence with the data receivers 300 and a second class mode register read-write modules 22 disposed in one-to-one correspondence with the mask receivers 400. The logic gate module 30 includes a first logic gate unit (not illustrated) and a second logic gate unit (not illustrated). The first logic gate unit is electrically connected to the multiple first class mode register read-write modules 21, and configured to calculate an OR value of the data outputted by each first class mode register read-write module 21 electrically connected with the first logic gate unit and then output the OR value. The second logic gate unit is configured such that: a first type input end is electrically connected to an output end of the first logic gate unit; a second type input end is electrically connected to the second class mode register read-write module 22; and an output end is electrically connected to the first cache module 200, and configured to calculate an OR value of data received by the second logic gate unit and then output the OR value.

It is to be noted that, the term "electrical connection" used herein is not limited to direct connection, but also includes connection through a logical unit.

Specifically, referring to FIG. 2, by setting the followings that: the mode register decoding module 10 is disposed corresponding to the receiver, for example, in one-to-one correspondence; since the receiver includes the mask receiver 400 and the multiple data receivers 300, the mode register read-write module includes the first class mode register read-write modules 21 disposed corresponding to the data receivers 300 and the second class mode register read-write module 22 disposed corresponding to the mask receiver 400; the first logic gate unit is electrically connected to the multiple first class mode register read-write modules 21, and configured to calculate the OR value of the data outputted by each first class mode register read-write module 21 electrically connected with the first logic gate unit and then output the OR value; the second logic gate unit is electrically connected to the output end of the first logic gate unit and the output end of the second class mode register read-write module 22, and calculates an OR value of the received data and then outputs the OR value; OR values of the data outputted by the mode register read-write modules are outputted, so as to share the data transmission path including the first logic gate unit and the second logic gate unit on the premise of outputting the selected mode register parameters. Therefore, the number of signal transmission wires between the mode register read-write module and the cache module inside the memory for caching the mode register parameters can be effectively decreased, and the complexity of wiring can be reduced.

Figure 3:
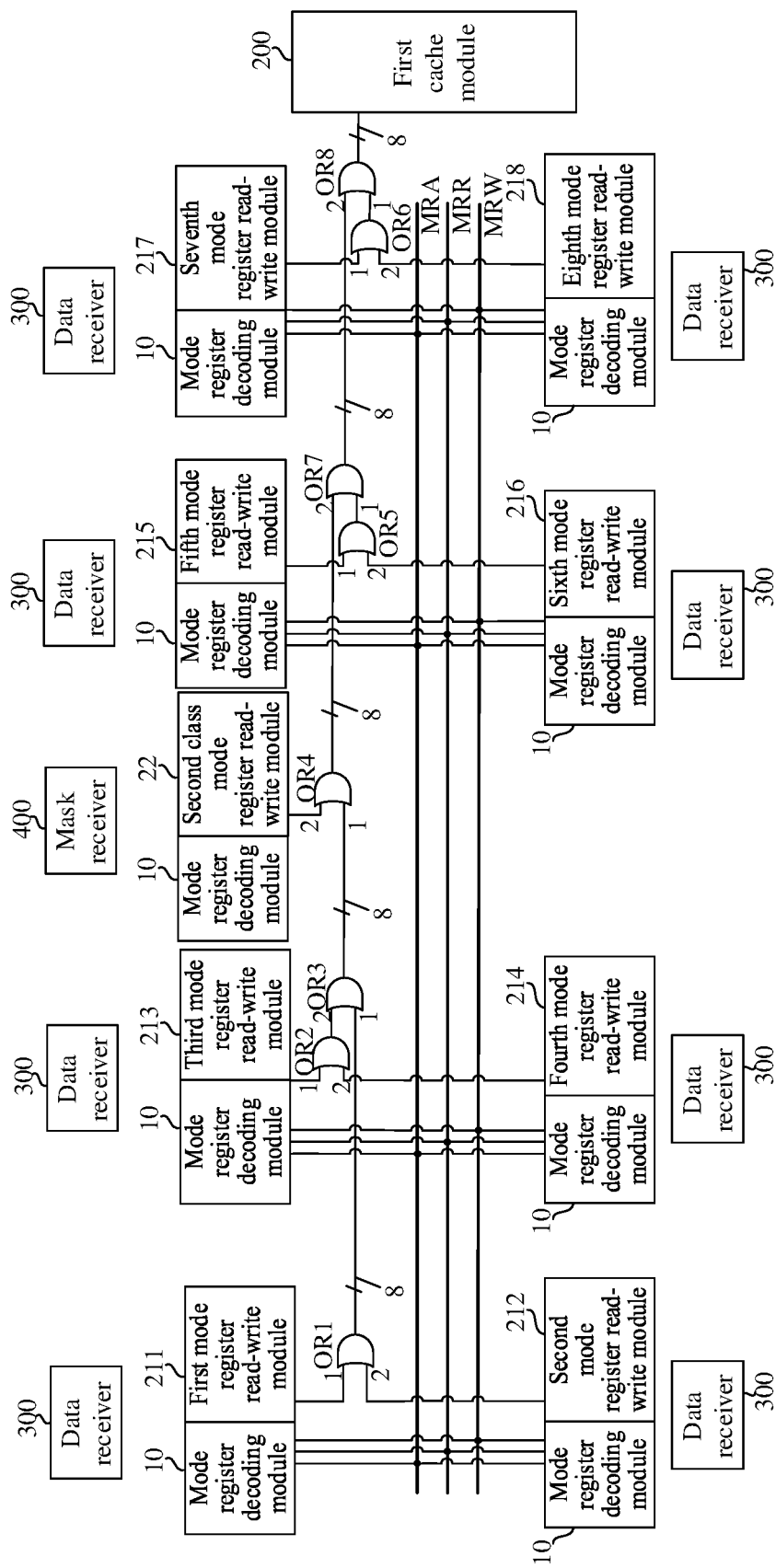
FIG. 3 is a schematic diagram of a circuit principle of a circuit for data transmission according to still another embodiment of the disclosure.

Referring to FIG. 3, in some embodiments of the disclosure, the first class mode register read-write module 21 includes a first mode register read-write module 211, a second mode register read-write module 212, a third mode register read-write module 213, and a fourth mode register read-write module 214. The first logic gate unit includes a first OR gate OR1 and a second OR gate OR2. The second logic gate unit includes a third OR gate OR3 and a fourth OR gate OR4. The first OR gate OR1 is configured such that: a first input end is electrically connected to the first mode register read-write module 211; and a second input end is electrically connected to the second mode register read-write module 212. The second OR gate OR2 is configured such that: a first input end is electrically connected to the third mode register read-write module 213; and a second input end is electrically connected to the fourth mode register read-write module 214. The third OR gate OR3 is configured such that: a first input end is the first type input end of the second logic gate unit and is electrically connected to an output end of the first OR gate OR1; and a second input end is the first type input end of the second logic gate unit and is electrically connected to an output end of the second OR gate OR2. The fourth OR gate OR4 is configured such that: a first input end is the first type input end of the second logic gate unit and is electrically connected to an output end of the third OR gate OR3; and a second input end is the second type input end of the second logic gate unit and is electrically connected to the second class mode register read-write module 22.

Specifically, continuously referring to FIG. 3, by setting the followings that: the first OR gate OR1 is configured to calculate OR values of data provided by the first mode register read-write module 211 and the second mode register read-write module 212 that are connected to the first OR gate; the second OR gate OR2 is configured to calculate OR values of data provided by the third mode register read-write module 213 and the fourth mode register read-write module 214 that are connected to the second OR gate; the third OR gate OR3 is configured to calculate OR values of data outputted by the first OR gate OR1 and the second OR gate OR2 that are connected to the third OR gate; the fourth OR gate OR4 is configured to calculate OR values of data outputted by the third OR gate OR3 and the second class mode register read-write module 22 that are connected to the fourth OR gate, to cause the fourth OR gate OR4 to output the OR values of the data outputted by the first mode register read-write module 211, the second mode register read-write module 212, the third mode register read-write module 213, the fourth mode register read-write module 214, and the second class mode register read-write module 22; any of the first mode register read-write module 211, the second mode register read-write module 212, the third mode register read-write module 213, the fourth mode register read-write module 214, and the second class mode register read-write module 22 corresponding to the mask receiver 400 outputs selected mode register parameters and outputs the mode register parameters selected by the mode register unselected enable signal after setting the mode register parameters to zero. Since the logic gate module 30 calculates the OR values, and an unselected register outputs 0, the OR value outputted by the fourth OR gate OR4 only represents parameters of the selected register. In addition, a data transmission channel including the first OR gate OR1, the second OR gate OR2, the third OR gate OR3, and the fourth OR gate OR4 is shared, and thus the number of the signal transmission wires among the first class mode register read-write module 21, the second class mode register read-write module 22, and the cache module inside the memory for caching the mode register parameters can be effectively decreased, and the complexity of wiring can be reduced.

As an example, continuously referring to FIG. 3, the first class mode register read-write module 21 further includes a fifth mode register read-write module 215, a sixth mode register read-write module 216, a seventh mode register read-write module 217, and an eighth mode register read-write module 218. The first logic gate unit further includes a fifth OR gate OR5 and a sixth OR gate OR6. The second logic gate unit further includes a seventh OR gate OR7 and an eighth OR gate OR8. The fifth OR gate OR5 is configured such that: a first input end is electrically connected to the fifth mode register read-write module 215; and a second input end is electrically connected to the sixth mode register read-write module 216. The sixth OR gate OR6 is configured such that: a first input end is electrically connected to the seventh mode register read-write module 217; and a second input end is electrically connected to the eighth mode register read-write module 218. The seventh OR gate OR7 is configured such that: a first input end is the first type input end of the second logic gate unit and is electrically connected to an output end of the fifth OR gate OR5; and a second input end is the first type input end of the second logic gate unit and is electrically connected to an output end of the fourth OR gate OR4. The eighth OR gate OR8 is configured such that: a first input end is the first type input end of the second logic gate unit and is electrically connected to an output end of the sixth OR gate OR6; a second input end is the first type input end of the second logic gate unit and is electrically connected to an output end of the seventh OR gate OR7; and an output end is electrically connected to the first cache module 200.

Specifically, continuously referring to FIG. 3, by setting the followings that: the fifth OR gate OR5 is configured to calculate OR values of data provided by the fifth mode register read-write module 215 and the sixth mode register read-write module 216 that are connected to the fifth OR gate; the sixth OR gate OR6 is configured to calculate OR values of data provided by the seventh mode register read-write module 217 and the eighth mode register read-write module 218 that are connected to the sixth OR gate; the seventh OR gate OR7 is configured to calculate OR values of data outputted by the fifth OR gate OR5 and the fourth OR gate OR4 that are connected to the seventh OR gate; the eighth OR gate OR8 is configured to calculate OR values of data outputted by the sixth OR gate OR6 and the seventh OR gate OR7 that are connected to the eighth OR gate and provide the OR values to the first cache module 200; the eighth OR gate OR8 outputs the OR values of the data outputted by the fifth mode register read-write module 215, the sixth mode register read-write module 216, the seventh mode register read-write module 217, and the eighth mode register read-write module 218, and outputs the OR value of the data outputted by the fourth OR gate OR4. In this way, any of the first mode register read-write module 211, the second mode register read-write module 212, the third mode register read-write module 213, the fourth mode register read-write module 214, the fifth mode register read-write module 215, the sixth mode register read-write module 216, the seventh mode register read-write module 217, the eighth mode register read-write module 218 and the second class mode register read-write module 22 corresponding to the mask receiver 400 outputs selected mode register parameters, and outputs the mode register parameters, after zero setting, selected by the mode register unselected enable signal MRS-UNSEL ENABLE. Since the logic gate module 30 calculates the OR values, and an unselected register outputs 0, the OR value outputted by the eighth OR gate OR8 only represents parameters of the selected register. In addition, a data transmission channel including the first OR gate OR1, the second OR gate OR2, the third OR gate OR3, the fourth OR gate OR4, the fifth OR gate OR5, the sixth OR gate OR6, the seventh OR gate OR7, and an eighth OR gate OR8 is shared, and thus the number of the signal transmission wires among the first class mode register read-write module 21, the second class mode register read-write module 22, and the cache module (such as a first cache module 200) inside the memory for caching the mode register parameters can be effectively decreased, and the complexity of wiring can be reduced.

As an example, continuously referring to FIG. 3, the number of bits of data transmitted by the first mode register read-write module 211, the number of bits of data transmitted by the second mode register read-write module 212, the number of bits of data transmitted by the third mode register read-write module 213, and the number of bits of data transmitted by the fourth mode register read-write module 214 are all a first preset bit number. The number of the first OR gates OR1, the number of the second OR gates OR2, the number of the third OR gates OR3, and the number of the fourth OR gates OR4 are all equal to the first preset bit number. In this embodiment, the data transmitted by the first mode register read-write module, the data transmitted by the second mode register read-write module, the data transmitted by the third mode register read-write module, and the data transmitted by the fourth mode register read-write module are accurately transmitted to an adjacent next stage circuit by using the first OR gate OR1, the second OR gate OR2, the third OR gate OR3, and the fourth OR gate OR4. As an example, continuously referring to FIG. 3, the number of bits of data transmitted by the fifth mode register read-write module 215, the number of bits of data transmitted by the sixth mode register read-write module 216, the number of bits of data transmitted by the seventh mode register read-write module 217, and the number of bits of data transmitted by the eighth mode register read-write module 218 are all the first preset bit number, for example, 8. The number of the fifth OR gates OR5, the number of the sixth OR gates OR6, the number of the seventh OR gates OR7, and the number of the eighth OR gates OR8 are all equal to the first preset bit number. In this embodiment, the data transmitted by the fifth mode register read-write module, the data transmitted by the sixth mode register read-write module, the data transmitted by the seventh mode register read-write module, and the data transmitted by the eighth mode register read-write module are accurately transmitted to an adjacent next stage circuit by using the fifth OR gate OR5, the sixth OR gate OR6, the seventh OR gate OR7, and the eighth OR gate OR8.

Figure 4:
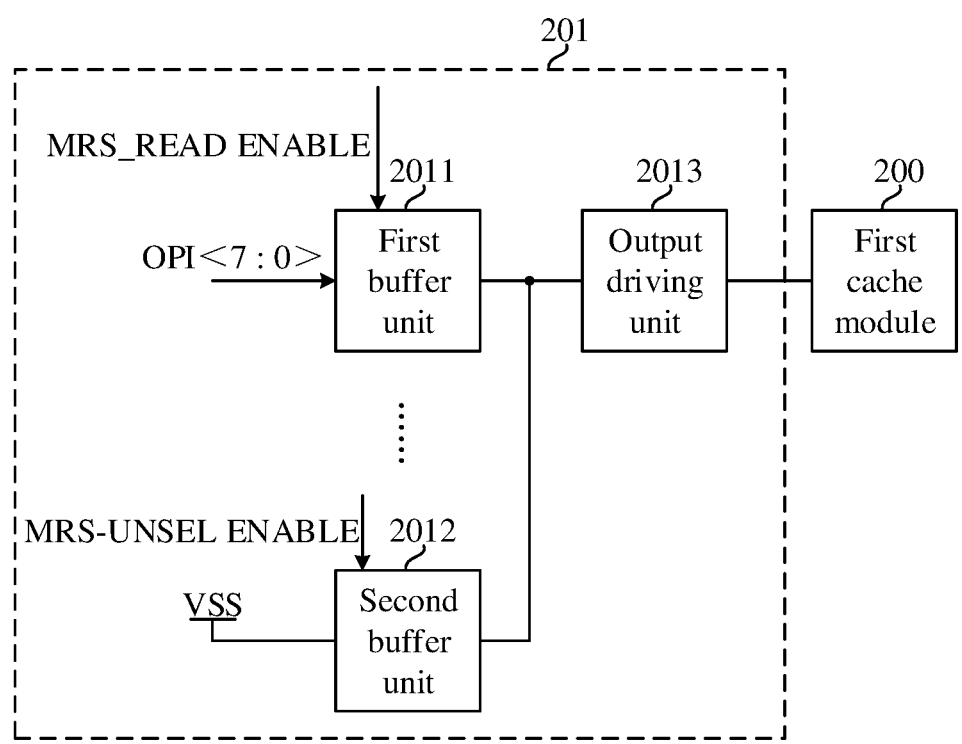
FIG. 4 is a schematic diagram of a circuit principle of a mode register read module in a circuit for data transmission according to an embodiment of the disclosure.

As an example, referring to FIG. 4, the mode register read-write module includes a mode register read module 201. The mode register read module 201 includes multiple first buffer units 2011, an output driving unit 2013, and a second buffer unit 2012. The first buffer unit 2011 is configured such that: an input end is configured to receive data cached by the mode register read-write module; and a control end is configured to receive the mode register read enable signal MRS_READ ENABLE and output an inversion signal of the received signal according to the mode register read enable signal MRS_READ ENABLE. The second buffer unit 2012 is configured such that: an input end is electrically connected to a preset voltage; and a control end is configured to receive the mode register unselected enable signal MRS-UNSEL ENABLE and output an inversion signal of the preset voltage according to the mode register unselected enable signal MRS-UNSEL ENABLE. The output driving unit 2013 is configured such that: an input end is electrically connected to the second buffer unit 2012 and each first buffer unit 2011; and an output end is electrically connected to the first cache module 200 and configured to output the selected data, and output the unselected data after zero setting according to the inversion signal of the preset voltage, so as to provide the data to the first cache module 200.

Specifically, continuously referring to FIG. 4, by setting the following that: the first buffer unit 2011 is configured to receive the data cached by the mode register read-write module, and to output an inversion signal of the received signal during a period that the mode register read enable signal MRS_READ ENABLE is in an active state or an enable state, and the first buffer unit is in a high-impedance state during a period that the mode register read enable signal MRS_READ ENABLE is in an inactive state or a disabled state; the second buffer unit 2012 is configured to receive the preset voltage, output the inversion signal of the received signal during the period that the mode register read enable signal MRS_READ ENABLE is in the active state or the enable state, and the second buffer unit is in the high-impedance state during the period that the mode register read enable signal is in the inactive state or the disabled state, such that the output driving unit 2013 outputs the selected data, and outputs the unselected data according to the inversion signal of the preset voltage after setting the unselected data to zero, thereby providing the data to the first cache module by sharing a data transmission path where the logic gate module is located and on the premise of accurately and efficiently outputting the selected mode register parameters and the mode register parameters (after zero setting) selected by the mode register unselected enable signal MRS-UNSEL ENABLE.

As an example, continuously referring to FIG. 4, the first cache module 200 includes a First-In-First-Out (FIFO) memory. The FIFO memory is configured such that: an input end is electrically connected to an output end of the output driving unit 2013 and configured to cache data provided by the output driving unit 2013, so as to cache the selected mode register parameters in the form of FIFO stack, thereby achieving the FIFO of data.

Figure 5:
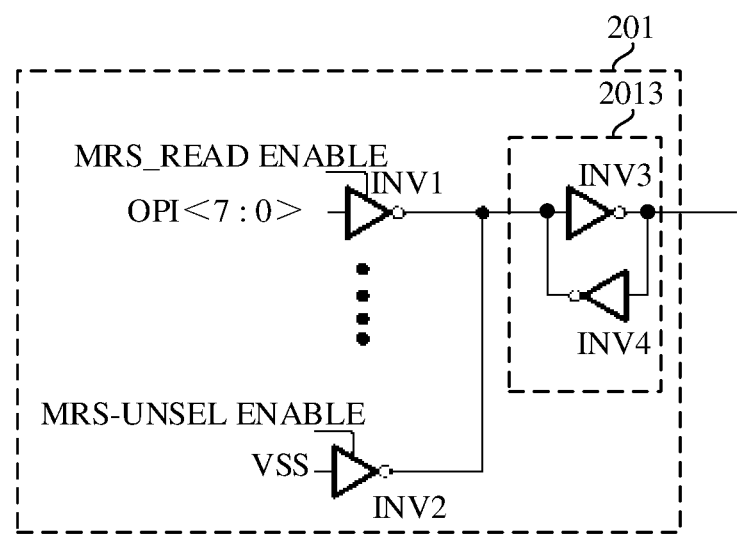
FIG. 5 is a schematic circuit diagram of a mode register read module in a circuit for data transmission according to an embodiment of the disclosure.

As an example, referring to FIG. 5, the first buffer unit 2011 includes a first gated inverter INV1. The number of the first gated inverter INV1 may be set to 8. The second buffer unit 2012 includes a second gated inverter INV2. The first gated inverter INV1 is configured such that: an input end is configured to receive data cached by the mode register read-write module; a control end is configured to receive the mode register read enable signal MRS_READ ENABLE; and an output end is electrically connected to the input end of the output driving unit 2013. The second gated inverter INV2 is configured such that: an input end is electrically connected to the preset voltage; a control end is configured to receive the mode register unselected enable signal MRS-UNSEL ENABLE and output the inversion signal of the preset voltage according to the mode register unselected enable signal MRS-UNSEL ENABLE; and an output end is electrically connected to the input end of the output driving unit 2013. In such manner, an inversion signal of the received data cached by the mode register read-write module is outputted during the period that the mode register read enable signal MRS_READ ENABLE is in the active state or the enable state by using the first gated inverter INV1; an inversion signal of the received preset voltage is outputted during the period that the mode register unselected enable signal MRS-UNSEL ENABLE is in the active state or the enable state by using the second gated inverter INV2; and the output driving unit 2013 outputs the selected data, and outputs the unselected data according to inversion signal of the preset voltage after setting the unselected data to zero.

As an example, continuously referring to FIG. 5, the preset voltage may be configured as a grounding voltage VSS, so that the preset voltage is set by connecting to a ground wire.

As an example, continuously referring to FIG. 5, the output driving unit 2013 includes a third inverter INV3 and a fourth inverter INV4. The third inverter INV3 is configured such that: an input end is electrically connected to the output end of the second gated inverter INV2 and the output end of each first gated inverter INV1; and an output end is the output end of the mode register read module 201. The fourth inverter INV4 is configured such that: an input end is electrically connected to the output end of the third inverter INV3, and an output end is electrically connected to the input end of the third inverter INV3. After the first gated inverter INV1 outputs an inversion signal of the received data OPI<7: 0> cached by the mode register read-write module during the period that the mode register read enable signal MRS_READ ENABLE is in the active state or the enable state, the data cached by the mode register read-write module is outputted by the third inverter INV3. After the second gated inverter INV2 outputs an inversion signal of the received preset voltage during the period that the mode register read enable signal MRS_READ ENABLE is in the active state or the enable state, the third inverter INV3 outputs 0.

As an example, in some embodiments, the mode register read-write module further includes a mode register write module. The mode register write module includes a third cache unit disposed corresponding to the write data of the data line. The third cache unit is configured such that: a data input end is configured to receive the data on the data line in the write state; and a clock input end is configured to receive the mode register write enable signal and cache the received data according to the mode register write enable signal.

Figure 6:
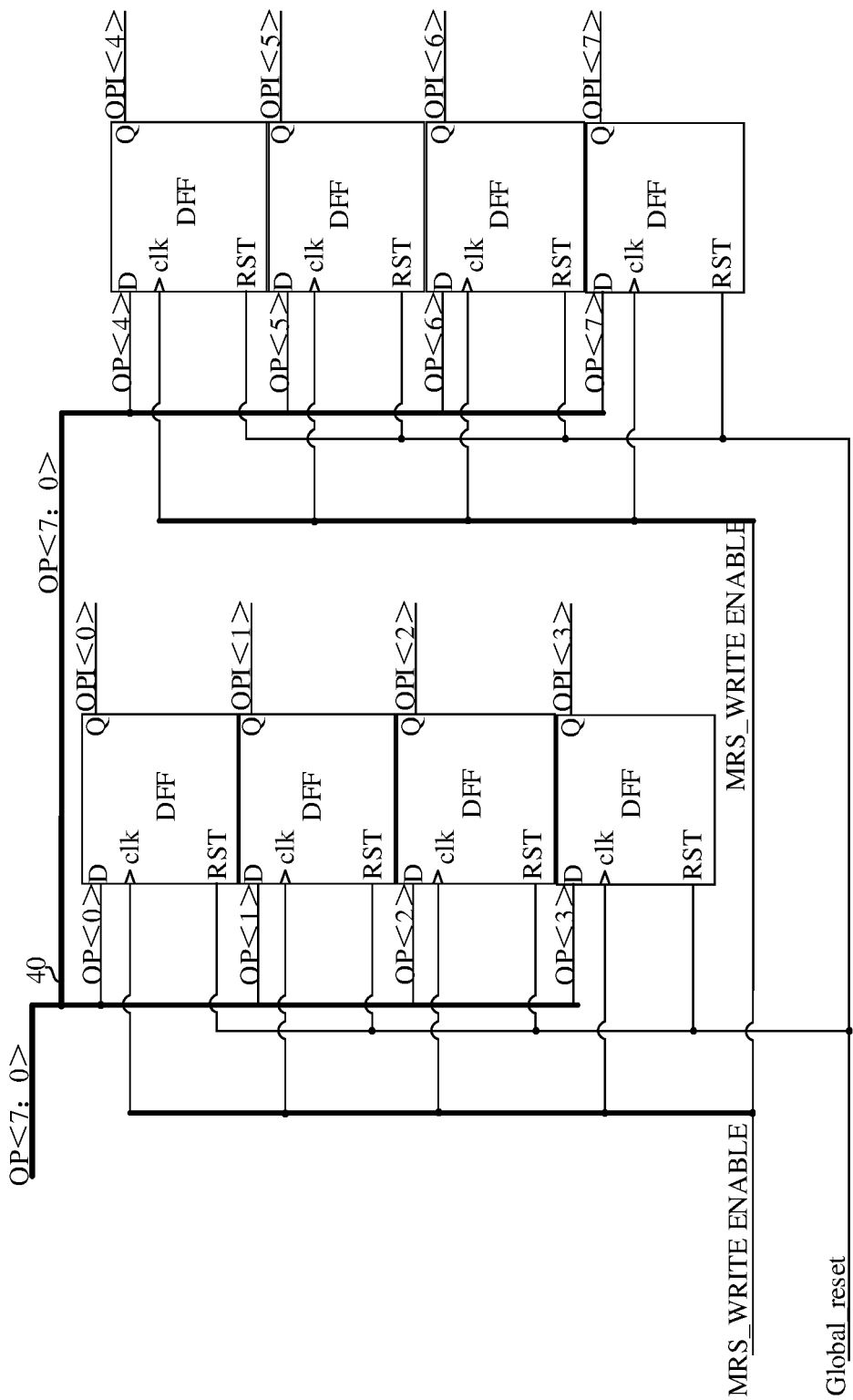
FIG. 6 is a schematic circuit diagram of a mode register write module in a circuit for data transmission according to an embodiment of the disclosure.

As an example, referring to FIG. 6, the third cache unit includes a flip-flop DFF. Each flip-flop DFF is configured such that: a data input end is configured to receive the data OP<7: 0> on the data line 40; and a clock input end is configured to receive the mode register write enable signal MRS_WRITE ENABLE and cache the received data according to the mode register write enable signal MRS_WRITE ENABLE. Each flip-flop DFF maintains an original state before receiving data during a global reset signal Global_reset being 1, and receives and caches the data on the data line 40 according to the mode register write enable signal MRS_WRITE ENABLE during the global reset signal Global_reset being 0.

Figure 7:
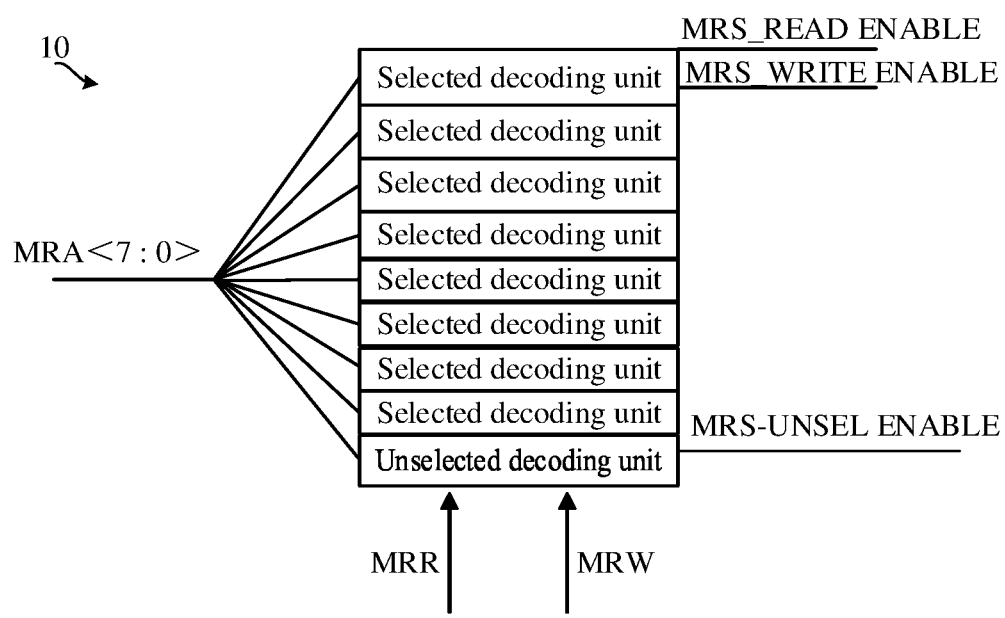
FIG. 7 is a schematic diagram of a circuit principle of a mode register decoding module in a circuit for data transmission according to an embodiment of the disclosure.

As an example, referring to FIG. 7, the mode register decoding module 10 includes an unselected decoding unit and multiple selected decoding units. The unselected decoding unit is configured to generate the mode register unselected enable signal MRS-UNSEL ENABLE according to the received mode register address information MRA, the mode register read control signal MRR, or the mode register write control signal MRW. Each selected decoding unit is configured to generate the mode register read enable signal MRS_READ ENABLE or the mode register write enable signal MRS_WRITE ENABLE according to the received mode register address information MRA, the mode register read control signal MRR, or the mode register write control signal MRW.

Figure 8:
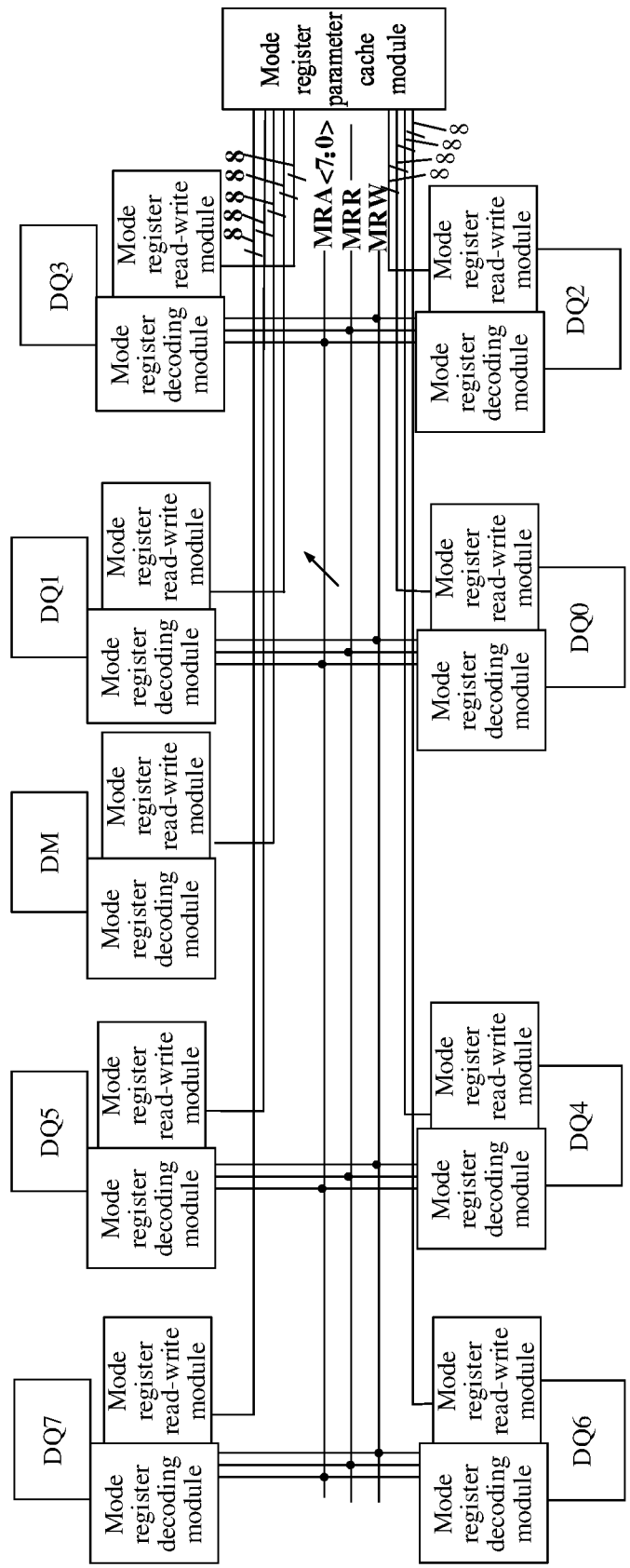
FIG. 8 is a schematic diagram of a circuit principle of a circuit for data transmission according to yet another embodiment of the disclosure.

Compared with FIG. 8, the mode register read-write modules disposed in one-to-one correspondence with a receiver DQ0, a receiver DQ1, a receiver DQ2, a receiver DQ3, a receiver DQ4, a receiver DQ5, a receiver DQ6, a receiver DQ7, and a receiver DM are electrically connected to mode register cache modules by using 8 signal transmission wires, a total of 72 signal transmission wires. However, in the disclosure, by designing the mode register decoding module and the logic gate module, and cooperating with the mode register read-write module, the sharing of the data transmission path where the logic gate module is located can be realized, and it only needs 8 signal transmission wires, thereby effectively decreasing the number of the signal transmission wires, and reducing the complexity of wiring. Continuously referring to Table 1 and Table 2, if MRA<7:0> is 10000000, it indicates that the 128-th mode register for controlling the data receiver DQL0 is selected. If MRA<7:0> is 10000001, it indicates that the 129-th mode register for controlling the data receiver DQL0 is selected, and so on. If MRA<7:0> is 10000111, it indicates that the 135-th mode register for controlling the data receiver DQL0 is selected. 10000XXX represents a common rule for a selected address. The mode register decoding module is designed according to this rule, so that whether a mode register is selected may be determined. By setting the mode register read-write module to cooperate with the mode register decoding modules which is set in one-to-one correspondence with the mode register read-write module, the mode register read-write module in the read state is configured to output the selected data and the unselected data after setting the unselected data to zero according to the received mode register read enable signal and the mode register unselected enable signal, to provide the data to the logic gate module. Logic gate module is shared to calculate the OR value of the data outputted by each mode register read-write module in the read state and to output the calculation result; on the premise of accurately and efficiently outputting the selected mode register parameters, the data transmission path where the logic gate module is located is shared for use. In such a manner the number of signal transmission wires between the receiver and the internal cache module configured to cache mode register parameters can be effectively decreased, the complexity of wiring can be decreased, and the energy consumption and interference between signals during signal transmission can be reduced on the premise of ensuring the efficiency and accuracy of data transmission.

Some embodiments of the disclosure provide a storage apparatus. The storage apparatus includes the circuit for data transmission described in any of the embodiments of the disclosure. On the premise of accurately and efficiently outputting the selected mode register parameters, the sharing of the data transmission path where the logic gate module is located can effectively decrease the number of signal transmission wires between the receiver and a cache module inside memory for caching the mode register parameters, and reduce the complexity of wiring. Since the number of the signal transmission wires is decreased, stray capacitance between the adjacent wires can be effectively reduced. Therefore, energy consumption and interference between signals during signal transmission can be reduced, a space area occupied by wire layout can be decreased, and the performance and reliability degradation caused by wire failure can be reduced.

Figure 9:
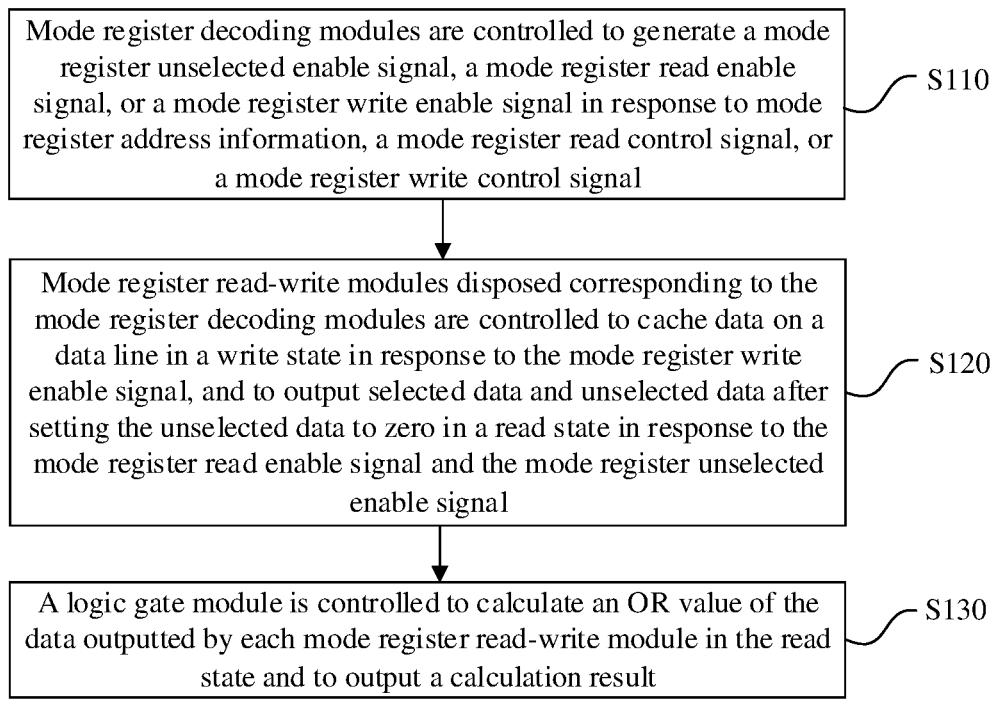
FIG. 9 is a schematic flowchart of a method for data transmission according to an embodiment of the disclosure.

Referring to FIG. 9, in some embodiments of the disclosure, a method for data transmission is provided and includes the following operations.

At operation S110, mode register decoding modules are controlled to generate a mode register unselected enable signal, a mode register read enable signal, or a mode register write enable signal in response to mode register address information, a mode register read control signal, or a mode register write control signal.

At operation S120, mode register read-write modules disposed corresponding to the mode register decoding modules are controlled to cache data on a data line in a write state in response to the mode register write enable signal, and are controlled to output selected data and unselected data after setting the unselected data to zero in a read state in response to the mode register read enable signal and the mode register unselected enable signal.

At operation S130, a logic gate module is controlled to calculate an OR value of the data outputted by each mode register read-write module in the read state and output a calculation result.

Specifically, continuously referring to FIG. 9, by controlling the mode register decoding module to generate the mode register unselected enable signal, the mode register read enable signal, or the mode register write enable signal according to the received mode register address information, the mode register read control signal, or the mode register write control signal; by controlling the mode register read-write module to cooperate with the mode register decoding modules which is set in one-to-one correspondence with the mode register read-write module, the mode register read-write module in the read state is controlled to output the selected data and the unselected data after setting the unselected data to zero according to the received mode register read enable signal and the mode register unselected enable signal, to provide the data to the logic gate module; by sharing logic gate module to calculate the OR value of the data outputted by each mode register read-write module in the read state and to output the calculation result, on the premise of accurately and efficiently outputting the selected mode register parameters, by sharing a data transmission path where the logic gate module is located, the number of signal transmission wires between the mode register read-write module and a cache module inside the memory for caching the mode register parameters can effectively decrease, and the complexity of wiring can be reduced. Since the number of the signal transmission wires is decreased, stray capacitance between the adjacent wires can be effectively reduced. Therefore, energy consumption and interference between signals during signal transmission can be reduced, a space area occupied by wire layout can be decreased, and the performance and reliability degradation caused by wire failure can be reduced.

For the specific limitation on the method for data transmission according to the above embodiments, refer to the limitation on the circuit for data transmission above, which is not described herein again.

It is to be understood that, although the various operations in the flowcharts of FIG. 9 are displayed in sequence as indicated by the arrows, these operations are not necessarily executed in sequence in the order indicated by the arrows. Unless otherwise specified herein, there is no strict order for the execution of these operations, and these operations can be executed in other orders. Moreover, at least part of the operations in FIG. 9 may include multiple operations or multiple stages. These operations or stages are not necessarily executed at a same time, but can be executed at different times. These operations or stages are not necessarily executed in sequence, but may be executed in turns or alternately with other operations or at least a part of the operations or stages in other steps.

Those of ordinary skill in the art will appreciate that implementing all or part of the processes in the methods described above may be accomplished by instructing associated hardware by a computer program, which may be stored in a non-volatile computer-readable storage medium, and which, when executed, may include processes as embodiments of the methods described above. Any reference to a memory, storage, a database, or other media used in the embodiments provided herein may include nonvolatile and/or volatile memories. The non-volatile memories may include a Read-Only Memory (ROM), a Programmable ROM (PROM), an Electrically Programmable ROM (EPROM), an Electrically Erasable and Programmable ROM (EEPROM), or a flash memory. The volatile memories may include a Random Access Memory (RAM), or an external cache memory. As not a limitation but an illustration, the RAM is available in many forms, such as a Static RAM (SRAM), a Dynamic RAM (DRAM), a Synchronous DRAM (SDRAM), a Double Data Rate SDRAM (DDRSDRAM), an Enhanced SDRAM (ESDRAM), a Synchronous Chain Channel (Synchlink) DRAM (SLDRAM), Rambus Direct RAM (RDRAM), a Direct Rambus Dynamic RAM (DRDRAM), and a Rambus Dynamic RAM (RDRAM), among others.

Note that the above-described embodiments are only intended for illustrative purposes and are not meant to limit the disclosure.

The technical features of the above-described embodiments may be randomly combined, and not all possible combinations of the technical features in the above-described embodiments are described for simplicity of description, however, as long as the combinations of the technical features do not contradict each other, they should be considered to be within the scope of the description of the present specification.

The embodiments described above represent only several implementation modes of the disclosure, and the description thereof is specific and detailed, but should not be construed as limiting the scope of disclosure accordingly. It should be pointed out that those of ordinary skill in the art can also make some modifications and improvements without departing from the concept of the disclosure, and these modifications and improvements all fall within the scope of protection of the disclosure. Accordingly, the scope of the patent of this application should be subject to the appended claims.

The invention claimed is:

1. A circuit for data transmission, comprising:
   a plurality of mode register decoding modules, configured to generate a mode register unselected enable signal, a mode register read enable signal, or a mode register write enable signal according to received mode register address information, a mode register read control signal, or a mode register write control signal;
   a plurality of mode register read-write modules, disposed corresponding to the plurality of mode register decoding modules, electrically connected to a data line, a first cache module, and corresponding mode register decoding modules, configured to cache data on the data line according to the received mode register write enable signal in a write state, and further configured to output selected data and unselected data after setting the unselected data to zero according to the mode register read enable signal and the mode register unselected enable signal in a read state; and
   a logic gate module, electrically connected to the first cache module and each mode register read-write module, and configured to calculate an OR value of the data outputted by the each mode register read-write module in the read state and to output a calculation result.

2. The circuit for data transmission of claim 1, wherein the mode register decoding module is disposed corresponding to a receiver, and the receiver comprises a mask receiver and a plurality of data receivers; the mode register read-write module comprises a first class mode register read-write module disposed corresponding to the data receiver and a second class mode register read-write module disposed corresponding to the mask receiver; and the logic gate module comprises:
   a first logic gate unit, electrically connected to a plurality of first class mode register read-write modules, and configured to calculate an OR value of the data outputted by each first class mode register read-write module electrically connected with the first logic gate unit and to output the OR value; and
   a second logic gate unit, configured such that: a first type input end is electrically connected to an output end of the first logic gate unit, a second type input end is electrically connected to the second class mode register read-write module, and an output end is electrically connected to the first cache module and configured to calculate an OR value of data received by the second logic gate unit and output the OR value.

3. The circuit for data transmission of claim 2, wherein the first class mode register read-write module comprises a first mode register read-write module, a second mode register read-write module, a third mode register read-write module, and a fourth mode register read-write module; the first logic gate unit comprises a first OR gate and a second OR gate; the second logic gate unit comprises a third OR gate and a fourth OR gate;
   the first OR gate is configured such that: a first input end is electrically connected to the first mode register read-write module, and a second input end is electrically connected to the second mode register read-write module;
   the second OR gate is configured such that: a first input end is electrically connected to the third mode register read-write module, and a second input end is electrically connected to the fourth mode register read-write module;
   the third OR gate is configured such that: a first input end is electrically connected to an output end of the first OR gate, and a second input end is electrically connected to an output end of the second OR gate; and
   the fourth OR gate is configured such that: a first input end is electrically connected to an output end of the third OR gate, and a second input end is electrically connected to the second class mode register read-write module.

4. The circuit for data transmission of claim 3, wherein the first class mode register read-write module further comprises a fifth mode register read-write module, a sixth mode register read-write module, a seventh mode register read-write module, and an eighth mode register read-write module; the first logic gate unit further comprises a fifth OR gate and a sixth OR gate; the second logic gate unit comprises a seventh OR gate and an eighth OR gate;
   the fifth OR gate is configured such that: a first input end is electrically connected to the fifth mode register read-write module, and a second input end is electrically connected to the sixth mode register read-write module;
   the sixth OR gate is configured such that: a first input end is electrically connected to the seventh mode register read-write module, and a second input end is electrically connected to the eighth mode register read-write module;
   the seventh OR gate is configured such that: a first input end is electrically connected to an output end of the fifth OR gate, and a second input end is electrically connected to an output end of the fourth OR gate; and the eighth OR gate is configured such that: a first input end is electrically connected to an output end of the sixth OR gate, a second input end is electrically connected to an output end of the seventh OR gate, and an output end is electrically connected to the first cache module.

5. The circuit for data transmission of claim 3, wherein a number of bits of data transmitted by the first mode register read-write module, a number of bits of data transmitted by the second mode register read-write module, a number of bits of data transmitted by the third mode register read-write module, and a number of bits of data transmitted by the fourth mode register read-write module are all a first preset number of bits; and
 a number of the first OR gates, a number of the second OR gates, a number of the third OR gates, and a number of the fourth OR gates are all equal to the first preset number of bits.

6. The circuit for data transmission of claim 4, wherein a number of bits of data transmitted by the fifth mode register read-write module, a number of bits of data transmitted by the sixth mode register read-write module, a number of bits of data transmitted by the seventh mode register read-write module, and a number of bits of data transmitted by the eighth mode register read-write module are all first preset number of bits; and
 a number of the fifth OR gates, a number of the sixth OR gates, a number of the seventh OR gates, and a number of the eighth OR gates are all equal to the first preset number of bits.

7. The circuit for data transmission of claim 1, wherein the mode register read-write module comprises a mode register read module, and the mode register read module comprises a plurality of first buffer units, an output driving unit, and a second buffer unit;
 the first buffer unit is configured such that: an input end is configured to receive data cached by the mode register read-write module; and a control end is configured to receive the mode register read enable signal and output an inversion signal of a received signal according to the mode register read enable signal;
 the second buffer unit is configured such that: an input end is electrically connected to a preset voltage; and a control end is configured to receive the mode register unselected enable signal and output an inversion signal of the preset voltage according to the mode register unselected enable signal; and
 the output driving unit is configured such that: an input end is electrically connected to the second buffer unit and each first buffer unit; and an output end is electrically connected to the first cache module and configured to: output a selected data, and output an unselected data according to the inversion signal of the preset voltage after setting the unselected data to zero, to provide to the first cache module.

8. The circuit for data transmission of claim 7, wherein the first cache module comprises:
 a First-In-First-Out (FIFO) memory, configured such that: an input end is electrically connected to the output end of the output driving unit and configured to cache data provided by the output driving unit.

9. The circuit for data transmission of claim 7, wherein the first buffer unit comprises a first gated inverter; the second buffer unit comprises a second gated inverter;
 the first gated inverter is configured such that: an input end is configured to receive data cached by the mode register read-write module, a control end is configured to receive the mode register read enable signal, and an output end is electrically connected to the input end of the output driving unit; and
 the second gated inverter is configured such that: an input end is electrically connected to the preset voltage; a control end is configured to receive the mode register unselected enable signal, and output the inversion signal of the preset voltage according to the mode register unselected enable signal; and an output end is electrically connected to the input end of the output driving unit.

10. The circuit for data transmission of claim 9, wherein the preset voltage is a grounding voltage.

11. The circuit for data transmission of claim 9, wherein the output driving unit comprises:
 a third inverter, configured such that: an input end is electrically connected to the output end of the second gated inverter and the output end of each first gated inverter, and an output end is an output end of the mode register read module; and
 a fourth inverter, configured such that: an input end is electrically connected to the output end of the third inverter, and an output end is electrically connected to the input end of the third inverter.

12. The circuit for data transmission of claim 2, wherein the mode register read-write module further comprises a mode register write module, and the mode register write module comprises a third cache unit disposed corresponding to write data of the data line; and
 the third cache unit is configured such that: a data input end is configured to receive the data on the data line in the write state, and a clock input end is configured to receive the mode register write enable signal and cache the received data according to the mode register write enable signal.

13. The circuit for data transmission of claim 12, wherein the third cache unit comprises:
 a flip-flop, configured such that: a data input end is configured to receive the data on the data line, and a clock input end is configured to receive the mode register write enable signal and cache the received data according to the mode register write enable signal.

14. The circuit for data transmission of claim 1, wherein each mode register decoding module comprises an unselected decoding unit and a plurality of selected decoding units;
 the unselected decoding unit is configured to generate the mode register unselected enable signal according to the received mode register address information, the mode register read control signal, or the mode register write control signal; and
 the selected decoding unit is configured to generate the mode register read enable signal or the mode register write enable signal according to the received mode register address information, the mode register read control signal, or the mode register write control signal.

15. A storage apparatus, comprising:
 the circuit for data transmission of claim 1.

16. A method for data transmission, comprising:
 controlling mode register decoding modules to generate a mode register unselected enable signal, a mode register read enable signal, or a mode register write enable signal in response to mode register address information, a mode register read control signal, or a mode register write control signal;
 controlling mode register read-write modules disposed corresponding to the mode register decoding modules to cache data on a data line in a write state in response to the mode register write enable signal, and output selected data and unselected data after setting the unselected data to zero in a read state in response to the mode register read enable signal and the mode register unselected enable signal; and controlling a logic gate module to calculate an OR value of the data outputted by each mode register read-write module in the read state and to output a calculation result.

\* \* \* \* \*